US009405616B2

(12) United States Patent  
Cohen

(10) Patent No.: US 9,405,616 B2  
(45) Date of Patent: Aug. 2, 2016

(54) RELIABILITY METRIC FOR DECODING HYPOTHESIS

(71) Applicant: QUALCOMM Incorporated, San Diego, CA (US)

(72) Inventor: Roee Cohen, Kibbutz Eyal (IL)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 14/274,266

(22) Filed: May 9, 2014

(65) Prior Publication Data

US 2015/0149874 A1 May 28, 2015

Related U.S. Application Data

(60) Provisional application No. 61/909,711, filed on Nov. 27, 2013.

(51) Int. Cl.
| | | |
|---|---|---|
| H03M 13/00 | (2006.01) | |
| G06F 11/10 | (2006.01) | |
| H03M 13/09 | (2006.01) | |
| H04L 1/00 | (2006.01) | |
| H04L 25/06 | (2006.01) | |
| H04L 27/227 | (2006.01) | |

(52) U.S. Cl.
CPC .......... *G06F 11/1004* (2013.01); *H03M 13/09* (2013.01); *H04L 1/004* (2013.01); *H04L 1/0045* (2013.01); *H04L 1/0046* (2013.01); *H04L 25/067* (2013.01); *H04L 27/2278* (2013.01)

(58) Field of Classification Search
CPC ..... H04L 1/0045; H04L 1/004; H04L 11/004; H04L 25/067; H04L 27/2278; H03M 13/09
See application file for complete search history.

(56) References Cited

U.S. PATENT DOCUMENTS

| 5,862,186 A * | 1/1999 | Kumar ................... H04B 1/707 375/142 |
| 6,175,590 B1 | 1/2001 | Stein |
| 2005/0138531 A1 | 6/2005 | Kim |
| 2006/0140313 A1 * | 6/2006 | Futami ................... H04L 1/001 375/343 |

(Continued)

FOREIGN PATENT DOCUMENTS

WO WO-02075955 A1 9/2002

OTHER PUBLICATIONS

International Search Report and Written Opinion—PCT/US2014/067324—ISA/EPO—Mar. 11, 2015.

*Primary Examiner* — Christine Tu  
(74) *Attorney, Agent, or Firm* — Loza & Loza LLP

(57) ABSTRACT

A reliability metric is used for determining whether to prune a decoding hypothesis. For example, a reliability metric can be generated for each possible hypothesis generated during blind decoding operations. The reliability metric can then be used in a pruning process whereby a determination to prune a given hypothesis is based on whether the corresponding reliability metric is above or below a reliability metric threshold. In some aspects, the reliability metric is based on the correlation between the symbols of a hypothesis and re-encoded symbols that are based on the hypothesis, whereby the correlation is normalized using an estimated power parameter that is independent of the hypothesis. Through the use of the reliability metric, decoding may be achieved with a low probability of false passes (in the case of noise) and a low probability of missed detection (in the case of a real signal).

30 Claims, 12 Drawing Sheets

(56) References Cited

U.S. PATENT DOCUMENTS

| | | |
|---|---|---|
| 2007/0234189 A1 | 10/2007 | Levy et al. |
| 2011/0083065 A1 | 4/2011 | Singh et al. |
| 2011/0182385 A1 | 7/2011 | Doan |
| 2011/0200058 A1* | 8/2011 | Mushkin ............... H04L 5/0046 370/475 |
| 2013/0223376 A1 | 8/2013 | Seong et al. |
| 2013/0283134 A1 | 10/2013 | Bai et al. |

* cited by examiner

RELIABILITY METRIC FOR DECODING HYPOTHESIS

CROSS-REFERENCE TO RELATED APPLICATION

This application claims priority to and the benefit of provisional patent application No. 61/909,711 filed in the U.S. patent office on Nov. 27, 2013, the entire content of which is incorporated herein by reference.

TECHNICAL FIELD

Aspects of the present disclosure relate generally to wireless communication, and more particularly, but not exclusively, to generating a reliability metric.

BACKGROUND

Wireless communication networks are widely deployed to provide various communication services such as telephony, video, data, messaging, broadcasts, and so on. Such networks, which are usually multiple access networks, support communications for multiple users by sharing the available network resources. One example of such a network is the UMTS Terrestrial Radio Access Network (UTRAN). The UTRAN is the radio access network (RAN) defined as a part of the Universal Mobile Telecommunications System (UMTS), a third generation (3G) mobile phone technology supported by the 3rd Generation Partnership Project (3GPP). UMTS, which is the successor to Global System for Mobile Communications (GSM) technologies, currently supports various air interface standards, such as Wideband-Code Division Multiple Access (W-CDMA), Time Division-Code Division Multiple Access (TD-CDMA), and Time Division-Synchronous Code Division Multiple Access (TD-SCDMA). UMTS also supports enhanced 3G data communications protocols, such as High Speed Packet Access (HSPA), which provides higher data transfer speeds and capacity to associated UMTS networks.

As the demand for mobile broadband access continues to increase, research and development continue to advance wireless technologies not only to meet the growing demand for mobile broadband access, but to advance and enhance the user experience with mobile communications.

Generally, a wireless communication network can simultaneously support communication for multiple wireless terminals. Each wireless terminal communicates with one or more base stations via transmissions on forward and reverse links. The forward link (or downlink) refers to a communication link from a base station to a wireless terminal, and the reverse link (or uplink) refers to a communication link from a wireless terminal to a base station.

Base stations communicate with mobile terminals over a downlink control channel to provide scheduling assignments and other control information to facilitate communicating with the base station. The base stations can transmit the control information according to a variety of formats, and the mobile terminals can be unaware of the format chosen by the base station. In this regard, mobile terminals can blindly decode transmissions sent over the control channel according to known formats. In some deployments, the structure of the control channel can be relatively complex. Consequently, blind decoding can sometimes render improper results, or false alarms (e.g., by selecting the wrong hypothesis for decoding the control channel), where the decoding appeared to be proper. Conventionally, false alarm detection is based on verifying a cyclic redundancy check (CRC) of a decoded packet. If data decoded using a decoding hypothesis passes CRC, the decoding hypothesis is assumed to be correct. However, there may be cases where a decoding hypothesis that passes CRC is still not reliable. For example, it is possible that a set of noise samples will pass CRC. Therefore, there is a desire to improve decoding in wireless communication networks.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the present disclosure provide for generating a reliability metric that can be used for determining whether to prune (e.g., reject) a decoding hypothesis. For example and without limitation, a reliability metric, based on an output of a decoder module, may be generated for each possible hypothesis generated during blind decoding operations. The reliability metric is then used in a pruning process whereby a determination to prune a given hypothesis is based on whether the corresponding reliability metric is above or below a reliability metric threshold.

Various aspects of the present disclosure provide a reliability metric that is based on the correlation between the symbols of a hypothesis and re-encoded symbols that are based on the hypothesis, whereby the correlation is normalized using an estimated power parameter that is independent of the hypothesis. Through the use of the disclosed reliability metric, decoding may be achieved with a low probability of false passes (in the case of noise) and a low probability of missed detection (in the case of a real signal).

For example, in one aspect, the disclosure provides a method for wireless communication including receiving a signal comprising a plurality of symbols; generating a decoding hypothesis based on the received signal; and generating a reliability metric associated with the decoding hypothesis, wherein the generation of the reliability metric includes calculating a correlation based on the decoding hypothesis and normalizing the correlation by a power parameter that is independent of the decoding hypothesis.

Another aspect of the disclosure provides an apparatus configured for wireless communication. The apparatus including means for receiving a signal comprising a plurality of symbols; means for generating a decoding hypothesis based on the received signal; and means for generating a reliability metric associated with the decoding hypothesis, wherein the generation of the reliability metric includes calculating a correlation based on the decoding hypothesis and normalizing the correlation by a power parameter that is independent of the decoding hypothesis.

Another aspect of the disclosure provides an apparatus for wireless communication that includes at least one processor and a memory coupled to the at least one processor. The at least one processor is configured to receive a signal comprising a plurality of symbols; generate a decoding hypothesis based on the received signal; and generate a reliability metric associated with the decoding hypothesis, wherein the generation of the reliability metric includes calculating a correlation based on the decoding hypothesis and normalizing the correlation by a power parameter that is independent of the decoding hypothesis.

Another aspect of the disclosure provides a non-transitory computer-readable medium having instructions for causing a computer to receive a signal comprising a plurality of symbols; generate a decoding hypothesis based on the received signal; and generate a reliability metric associated with the decoding hypothesis, wherein the generation of the reliability metric includes calculating a correlation based on the decoding hypothesis and normalizing the correlation by a power parameter that is independent of the decoding hypothesis.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

Figure 1:
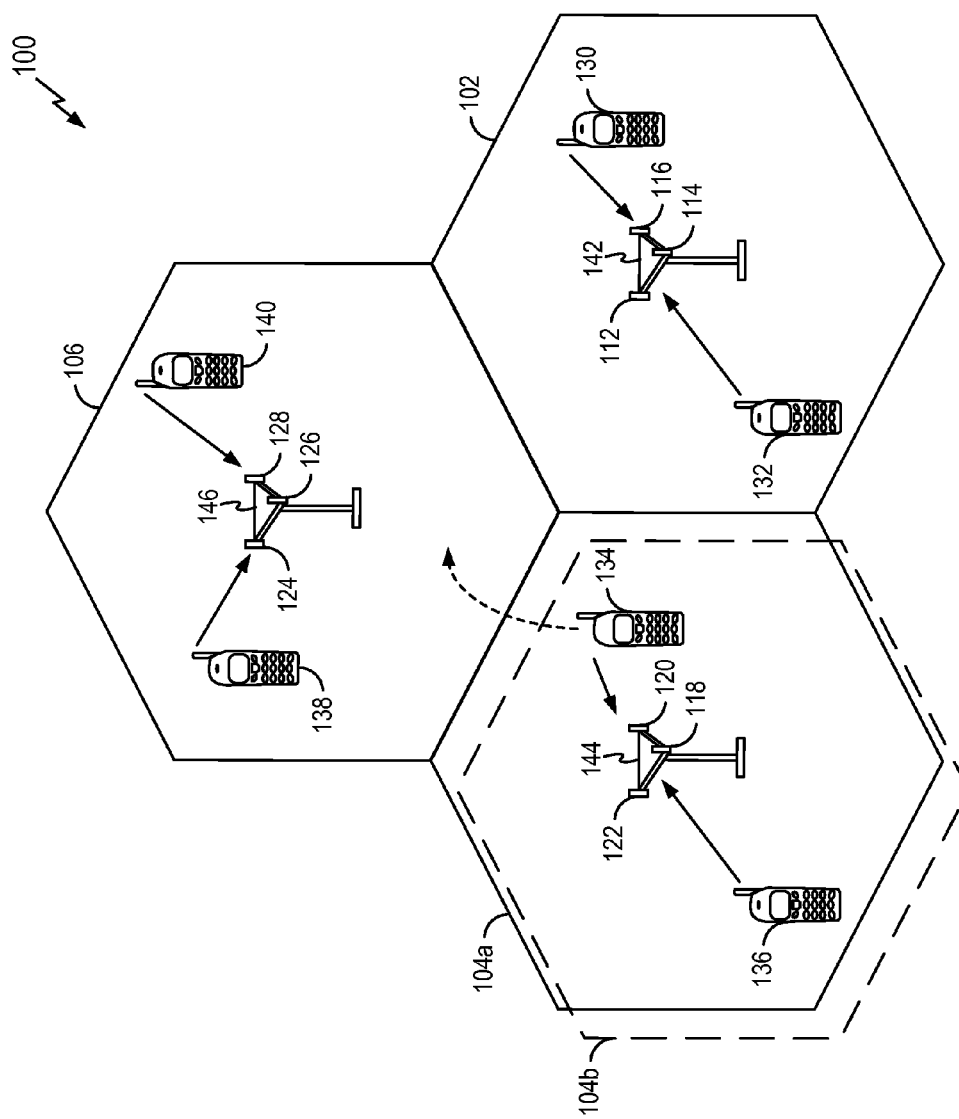
FIG. 1 is a conceptual diagram illustrating an example of a network environment in which one or more aspects of the present disclosure may find application.

The various concepts presented throughout this disclosure may be implemented across a broad variety of telecommunication systems, network architectures, and communication standards. Referring to FIG. 1, by way of example and without limitation, a simplified access network 100 in a UMTS Terrestrial Radio Access Network (UTRAN) architecture, which may utilize High-Speed Packet Access (HSPA), is illustrated. The system includes multiple cellular regions (cells), including cells 102, 104, and 106, each of which may include one or more sectors. Cells may be defined geographically, e.g., by coverage area, and/or may be defined in accordance with a frequency, scrambling code, etc. That is, the illustrated geographically-defined cells 102, 104, and 106 may each be further divided into a plurality of cells, e.g., by utilizing different frequencies or scrambling codes. For example, cell 104a may utilize a first frequency or scrambling code, and cell 104b, while in the same geographic region and served by the same Node B 144, may be distinguished by utilizing a second frequency or scrambling code.

In a cell that is divided into sectors, the multiple sectors within a cell can be formed by groups of antennas with each antenna responsible for communication with UEs in a portion of the cell. For example, in cell 102, antenna groups 112, 114, and 116 may each correspond to a different sector. In cell 104, antenna groups 118, 120, and 122 each correspond to a different sector. In cell 106, antenna groups 124, 126, and 128 each correspond to a different sector.

The cells 102, 104 and 106 may include several UEs that may be in communication with one or more sectors of each cell 102, 104 or 106. For example, UEs 130 and 132 may be in communication with Node B 142, UEs 134 and 136 may be in communication with Node B 144, and UEs 138 and 140 may be in communication with Node B 146. Here, each Node B 142, 144, 146 is configured to provide an access point to a core network 204 (see FIG. 2) for all the UEs 130, 132, 134, 136, 138, 140 in the respective cells 102, 104, and 106.

Figure 2:
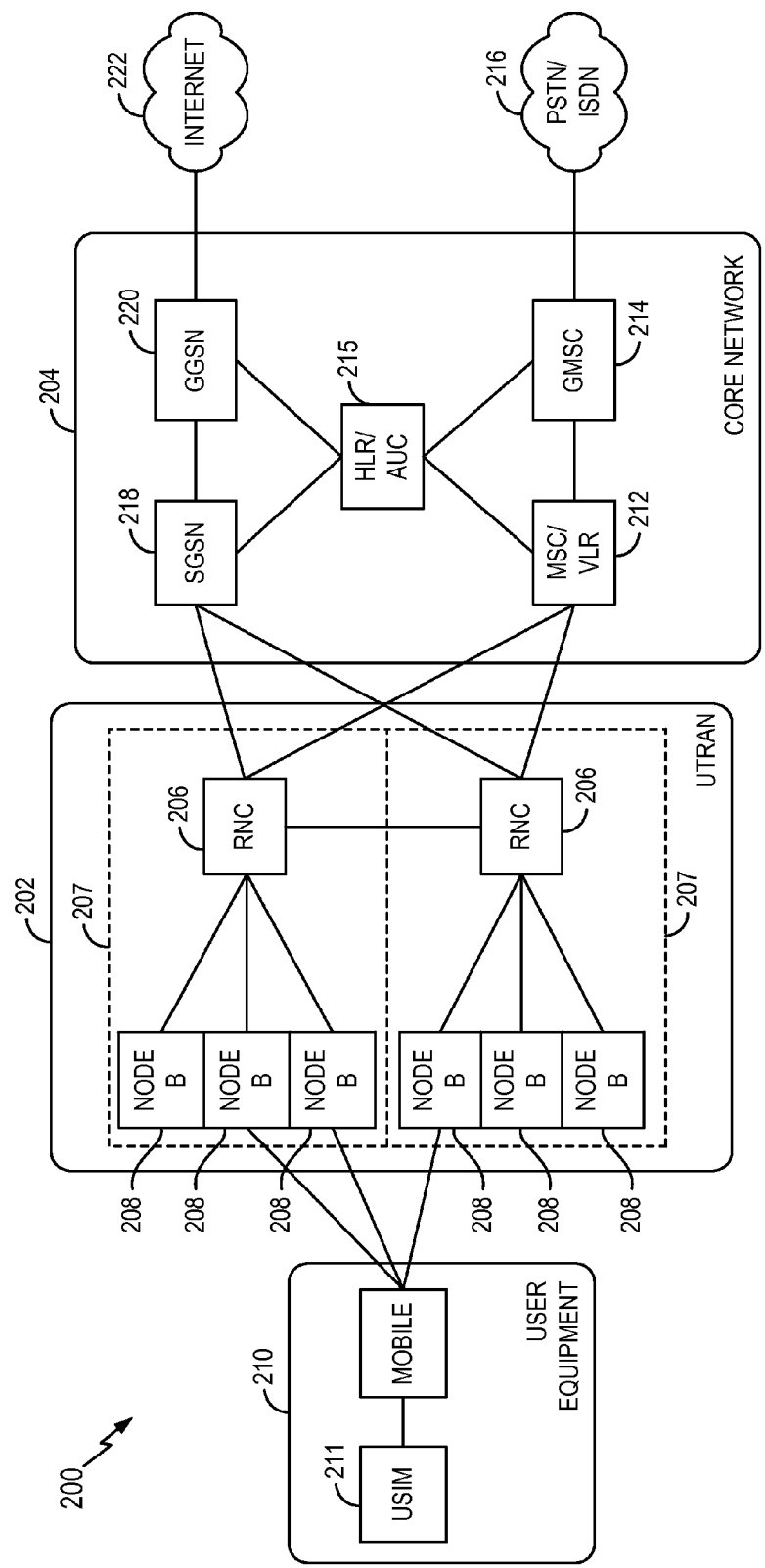
FIG. 2 is a block diagram illustrating an example of a communication system in which one or more aspects of the disclosure may find application.

Referring now to FIG. 2, by way of example and without limitation, various aspects of the present disclosure are illustrated with reference to a Universal Mobile Telecommunications System (UMTS) system 200 employing a wideband code division multiple access (W-CDMA) air interface. A UMTS network includes three interacting domains: a Core Network (CN) 204, a UMTS Terrestrial Radio Access Network (UTRAN) 202, and User Equipment (UE) 210. In this example, the UTRAN 202 may provide various wireless services including telephony, video, data, messaging, broadcasts, and/or other services. The UTRAN 202 may include a plurality of Radio Network Subsystems (RNSs) such as the illustrated RNSs 207, each controlled by a respective Radio Network Controller (RNC) such as an RNC 206. Here, the UTRAN 202 may include any number of RNCs 206 and RNSs 207 in addition to the illustrated RNCs 206 and RNSs 207. The RNC 206 is an apparatus responsible for, among other things, assigning, reconfiguring and releasing radio resources within the RNS 207. The RNC 206 may be interconnected to other RNCs (not shown) in the UTRAN 202 through various types of interfaces such as a direct physical connection, a virtual network, or the like, using any suitable transport network.

The geographic region covered by the RNS 207 may be divided into a number of cells, with a radio transceiver apparatus serving each cell. A radio transceiver apparatus is commonly referred to as a Node B in UMTS applications, but may also be referred to by those skilled in the art as a base station (BS), a base transceiver station (BTS), a radio base station, a radio transceiver, a transceiver function, a basic service set (BSS), an extended service set (ESS), an access point (AP), or some other suitable terminology. For clarity, three Node Bs 208 are shown in each RNS 207; however, the RNSs 207 may include any number of wireless Node Bs. The Node Bs 208 provide wireless access points to a core network (CN) 204 for any number of mobile apparatuses. Examples of a mobile apparatus include a cellular phone, a smart phone, a session initiation protocol (SIP) phone, a laptop, a notebook, a netbook, a smartbook, a personal digital assistant (PDA), a satellite radio, a global positioning system (GPS) device, a multimedia device, a video device, a digital audio player (e.g., MP3 player), a camera, a game console, or any other similar functioning device. The mobile apparatus is commonly referred to as user equipment (UE) in UMTS applications, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. In a UMTS system, the UE 210 may further include a universal subscriber identity module (USIM) 211, which contains a user's subscription information to a network. For illustrative purposes, one UE 210 is shown in communication with a number of the Node Bs 208. The downlink (DL), also called the forward link, refers to the communication link from a Node B 208 to a UE 210, and the uplink (UL), also called the reverse link, refers to the communication link from a UE 210 to a Node B 208.

The core network 204 interfaces with one or more access networks, such as the UTRAN 202. As shown, the core network 204 is a UMTS core network. However, as those skilled in the art will recognize, the various concepts presented throughout this disclosure may be implemented in a RAN, or other suitable access network, to provide UEs with access to types of core networks other than UMTS networks.

The illustrated UMTS core network 204 includes a circuit-switched (CS) domain and a packet-switched (PS) domain. Some of the circuit-switched elements are a Mobile services Switching Centre (MSC), a Visitor Location Register (VLR), and a Gateway MSC (GMSC). Packet-switched elements include a Serving GPRS Support Node (SGSN) and a Gateway GPRS Support Node (GGSN). Some network elements, like EIR, HLR, VLR, and AuC may be shared by both of the circuit-switched and packet-switched domains.

In the illustrated example, the core network 204 supports circuit-switched services with a MSC 212 and a GMSC 214. In some applications, the GMSC 214 may be referred to as a media gateway (MGW). One or more RNCs, such as the RNC 206, may be connected to the MSC 212. The MSC 212 is an apparatus that controls call setup, call routing, and UE mobility functions. The MSC 212 also includes a visitor location register (VLR) that contains subscriber-related information for the duration that a UE is in the coverage area of the MSC 212. The GMSC 214 provides a gateway through the MSC 212 for the UE to access a circuit-switched network 216. The GMSC 214 includes a home location register (HLR) 215 containing subscriber data, such as the data reflecting the details of the services to which a particular user has subscribed. The HLR is also associated with an authentication center (AuC) that contains subscriber-specific authentication data. When a call is received for a particular UE, the GMSC 214 queries the HLR 215 to determine the UE's location and forwards the call to the particular MSC serving that location.

The illustrated core network 204 also supports packet-data services with a serving GPRS support node (SGSN) 218 and a gateway GPRS support node (GGSN) 220. GPRS, which stands for General Packet Radio Service, is designed to provide packet-data services at speeds higher than those available with standard circuit-switched data services. The GGSN 220 provides a connection for the UTRAN 202 to a packet-based network 222. The packet-based network 222 may be the Internet, a private data network, or some other suitable packet-based network. The primary function of the GGSN 220 is to provide the UEs 210 with packet-based network connectivity. Data packets may be transferred between the GGSN 220 and the UEs 210 through the SGSN 218, which performs primarily the same functions in the packet-based domain as the MSC 212 performs in the circuit-switched domain.

The UMTS air interface may be a spread spectrum Direct-Sequence Code Division Multiple Access (DS-CDMA) system. The spread spectrum DS-CDMA spreads user data through multiplication by a sequence of pseudorandom bits called chips. The W-CDMA air interface for UMTS is based on such DS-CDMA technology and additionally calls for a frequency division duplexing (FDD). FDD uses a different carrier frequency for the uplink (UL) and downlink (DL) between a Node B 208 and a UE 210. Another air interface for UMTS that utilizes DS-CDMA, and uses time division duplexing (TDD), is the TD-SCDMA air interface. Those skilled in the art will recognize that although various examples described herein may refer to a W-CDMA air interface, the underlying principles are equally applicable to a TD-SCDMA air interface.

A high speed packet access (HSPA) air interface includes a series of enhancements to the 3G/W-CDMA air interface, facilitating greater throughput and reduced latency. Among other modifications over prior releases, HSPA utilizes hybrid automatic repeat request (HARQ), shared channel transmission, and adaptive modulation and coding. The standards that define HSPA include HSDPA (high speed downlink packet access) and HSUPA (high speed uplink packet access, also referred to as enhanced uplink, or EUL).

Figure 3:
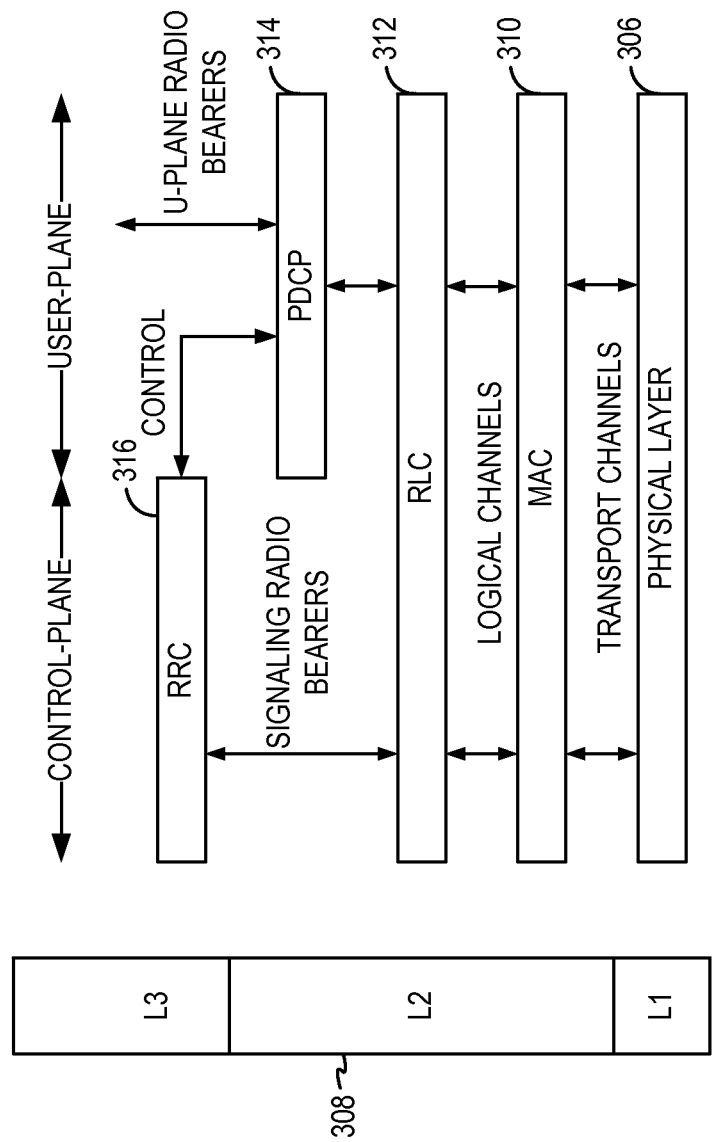
FIG. 3 is a conceptual diagram illustrating an example of a radio protocol architecture for a user plane and a control plane.

In a wireless telecommunication system, the radio protocol architecture between a mobile device and a cellular network may take on various forms depending on the particular application. An example for a 3GPP high-speed packet access (HSPA) system will now be presented with reference to FIG. 3, illustrating an example of the radio protocol architecture for the user and control planes between the UE 210 and the Node B 208. Here, the user plane or data plane carries user traffic, while the control plane carries control information, i.e., signaling.

Turning to FIG. 3, the radio protocol architecture for the UE 210 and Node B 208 is shown with three layers: Layer 1, Layer 2, and Layer 3. Although not shown, the UE 210 may have several upper layers above the L3 layer including a network layer (e.g., IP layer) that is terminated at a PDN gateway on the network side, and an application layer that is terminated at the other end of the connection (e.g., far end UE, server, etc.).

At Layer 3, the RRC layer 316 handles control plane signaling between the UE 210 and the Node B 208. RRC layer 316 includes a number of functional entities for routing higher layer messages, handling broadcast and paging functions, establishing and configuring radio bearers, etc.

The data link layer, called Layer 2 (L2 layer) 308 is between Layer 3 and the physical layer 306, and is responsible for the link between the UE 210 and Node B 208. In the illustrated air interface, the L2 layer 308 is split into sublayers. In the control plane, the L2 layer 308 includes two sublayers: a medium access control (MAC) sublayer 310 and a radio link control (RLC) sublayer 312. In the user plane, the L2 layer 308 additionally includes a packet data convergence protocol (PDCP) sublayer 314. Of course, those of ordinary skill in the art will comprehend that additional or different sublayers may be utilized in a particular implementation of the L2 layer 308, still within the scope of the present disclosure.

The PDCP sublayer 314 provides multiplexing between different radio bearers and logical channels. The PDCP sublayer 314 also provides header compression for upper layer data packets to reduce radio transmission overhead, security by ciphering the data packets, and handover support for UEs between Node Bs.

The RLC sublayer 312 provides segmentation and reassembly of upper layer data packets, retransmission of lost data packets, and reordering of data packets to compensate for out-of-order reception due to a hybrid automatic repeat request (HARQ).

The MAC sublayer 310 provides multiplexing between logical channels and transport channels. The MAC sublayer 310 is also responsible for allocating the various radio resources (e.g., resource blocks) in one cell among the UEs. The MAC sublayer 310 is also responsible for HARQ operations.

Layer 1 is the lowest layer and implements various physical layer signal processing functions. Layer 1 will be referred to herein as the physical layer (PHY) 306. At the PHY layer 306, the transport channels are mapped to different physical channels.

Data generated at higher layers, all the way down to the MAC layer 310, are carried over the air through transport channels. 3GPP Release 5 specifications introduced downlink enhancements referred to as HSDPA. HSDPA utilizes as its transport channel the high-speed downlink shared channel (HS-DSCH). The HS-DSCH is implemented by three physical channels: the high-speed physical downlink shared channel (HS-PDSCH), the high-speed shared control channel (HS-SCCH), and the high-speed dedicated physical control channel (HS-DPCCH).

Among these physical channels, the HS-DPCCH carries HARQ ACK/NACK signaling on the uplink to indicate whether a corresponding packet transmission was decoded successfully. That is, with respect to the downlink, the UE 210 provides feedback to the Node B 208 over the HS-DPCCH to indicate whether it correctly decoded a packet on the downlink.

HS-DPCCH further includes feedback signaling from the UE 210 to assist the Node B 208 in taking the right decision in terms of modulation and coding scheme and precoding weight selection, this feedback signaling including the channel quality indicator (CQI) and precoding control information (PCI).

3GPP Release 6 specifications introduced uplink enhancements referred to as Enhanced Uplink (EUL) or High Speed Uplink Packet Access (HSUPA). HSUPA utilizes as its transport channel the EUL Dedicated Channel (E-DCH). The E-DCH is transmitted in the uplink together with the Release 99 DCH. The control portion of the DCH, that is, the DPCCH, carries pilot bits and downlink power control commands on uplink transmissions. In the present disclosure, the DPCCH may be referred to as a control channel (e.g., a primary control channel) or a pilot channel (e.g., a primary pilot channel) in accordance with whether reference is being made to the channel's control aspects or its pilot aspects.

The E-DCH is implemented by physical channels including the E-DCH Dedicated Physical Data Channel (E-DPDCH) and the E-DCH Dedicated Physical Control Channel (E-DPCCH). In addition, HSUPA relies on additional physical channels including the E-DCH HARQ Indicator Channel (E-HICH), the E-DCH Absolute Grant Channel (E-AGCH), and the E-DCH Relative Grant Channel (E-RGCH). Further, in accordance with aspects of the present disclosure, for HSUPA with MIMO utilizing two transmit antennas, the physical channels include a Secondary E-DPDCH (S-E-DPDCH), a Secondary E-DPCCH (S-E-DPCCH), and a Secondary DPCCH (S-DPCCH).

Thus, UMTS networks utilize a channel structure whereby logical channels (e.g., logical control and traffic channels for uplink and downlink traffic) are mapped to transport channels which are, in turn, mapped to the physical channels. Different frame structures, coding, and operating modes may be deployed depending on, for example, the traffic being carried and deployments decisions.

Blind Decoding

Control channels such as a dedicated control channel (DCCH) and a physical DCCH (PDCCH) may carry scheduling assignments and other control information. However, timing, location, size, and CRC masking associated with downlink control information might not be known to a receiver. To address this issue, the receiver may perform blind decoding over possible hypotheses. In some scenarios, there are a relatively large number of hypotheses (e.g., up to and even exceeding 100) corresponding to the possible combinations of control information that a transmitter could send to the receiver. The complex structure of control channel blind decoding in such scenarios typically results in false alarms (e.g., selection of the wrong hypothesis). Thus, intelligent rules for pruning the decoding results are desirable so that unreliable hypotheses are rejected as a function of a respective reliability metric.

As a specific example, in single rate adaptive multi-rate (AMR) calls in blind transport format detection (BTFD) mode with a DCCH transport format (TF) of {0x148, 1x148}, it is possible to have a hypothesis pass CRC even for the case of 0x148, which means that CRC passes on samples that only include noise. If this block of "information" is then assumed to be valid control information (due to CRC passing for the block), erroneous control information could be used by the receiver. While the likelihood of this scenario occurring may be low (due to the unlikelihood that received noise symbols will actually correspond to correct CRC), call drops could occur if such erroneous control information is used by the receiver.

Pruning of Blind Decoding Results

The disclosure relates in some aspects to using a reliability metric to determine (e.g., estimate) whether a given hypothesis based on received symbols is reliable or unreliable. In the discussion that follows, a reliable hypothesis is one that corresponds to a real signal while an unreliable hypothesis is one that corresponds to noise. Other implementations could use different characterizations of reliable and unreliable hypotheses.

The teachings herein may be used in conjunction with various types of information. For purposes of illustration, certain aspects of the disclosure are described in the context of blind decoding of control information. However, the disclosed concepts also may be used to decode data or other types of information.

Figure 4:
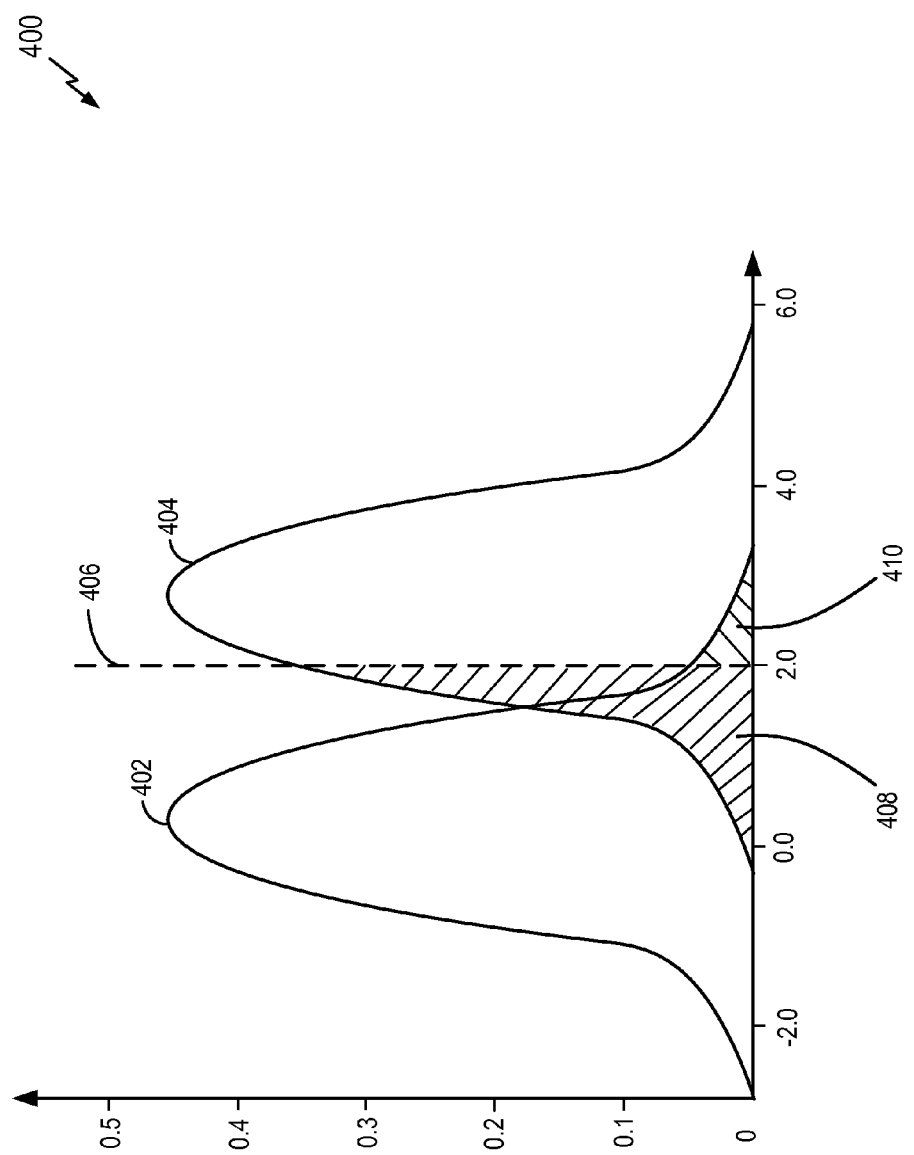
FIG. 4 is a graph illustrating examples of probability density functions.

The graph 400 of FIG. 4 depicts a first probability density function (pdf) 402 for the case where received symbols are noise only and a second probability density function 404 for the case when received symbols are a real signal. A reliability metric threshold 406 can be compared to a reliability metric calculated for a given hypothesis (e.g., corresponding to a set of received symbols) to determine whether the hypothesis is reliable or unreliable. In this example, the reliability metric threshold 406 has a value of 2.0. If a reliability metric falls below the threshold 406 (metric less than 2.0), the received symbols are estimated to be noise. If the reliability metric is above the threshold 406 (metric greater than 2.0), the received symbols are estimated to be a real signal.

As indicated in this example, there is a first region 408 associated with missed detection probability. For example, the first region 408 may represent a real signal that has been received, but the hypothesis is deemed unreliable. In addition, there is a second region 410 associated with false pass probability. For example, the second region 410 may represent that only noise has been received, but the hypothesis is deemed reliable.

The disclosure relates in some aspects to techniques for improving the process of pruning hypotheses that represent noise samples, rather than real information. In some implementations, the disclosed techniques involve distinguishing between CRC PASS results on a proper block and CRC PASS results on noise samples. To this end, a metric referred to as $M_{RCM}$, is calculated for each hypothesis in an attempt to achieve a low probability of a false CRC PASS result (in the case of noise) as well as a low probability of missed detection (in the case of a real signal).

The metric $M_{RCM}$ is compared to a threshold to determine whether a packet associated with the hypothesis is a proper packet or noise. Equation 1 illustrates an example of an $M_{RCM}$ metric.

$$M_{RCM} = \frac{\frac{1}{N_D} \cdot \sum_{k=1}^{N_D} b'_k \cdot y_k}{\sqrt{PowerEst(\text{other symbols in } CCTrCh., DPsym.)}} \quad \text{EQUATION 1}$$

Where:
$N_D$=the number of transmitted symbols in the examined TrCh in the dedicated physical data channel (DPDCH).
$b'_k \in \{-1,+1\}$=the $k^{th}$ re-encoded symbol.
$y_k$=the $k^{th}$ symbol of a hypothesis.
PowerEst=a power estimate of the corresponding symbols.
Other symbols in CCTrCh=all the detected symbols in the coded composite transport channels (CCTrCh) except the symbol(s) in the TrCh that is being diagnosed (i.e., $Y_k$).
DPsym=the symbols correspond to the dedicated pilots in the dedicated physical control channel (DPCCH).

The numerator of Equation 1 employs a correlation operation that generates a value indicative of whether the received symbols $y_k$ correspond to valid information expected to be transmitted by a transmitter. Here, the $b'_k$ values represent a re-creation (at the receiver) of the encoding process performed at the transmitter. When the transmitter is transmitting real information, a series of information bits generated by the transmitter are encoded at the transmitter to provide a series of symbols that are then sent to the receiver. At the receiver, the received symbols are decoded to generate a series of bits that is expected to correspond to the bits generated by the transmitter. For example, the receiver can include a Viterbi decoder for decoding the received symbols. To verify that the decoded symbols accurately represent a set of expected transmitted symbols, the decoded bits are re-encoded (e.g., using the same encoding process that was used by the transmitter) to generate the $b'_k$ values. If the received symbols $y_k$ do in fact correspond to real information (as opposed to noise), there will be a high correlation between the $y_k$ values and the $b'_k$ values.

The denominator of Equation 1 is a root of a power estimate over a set of received symbols. Thus, in some aspects, the denominator corresponds to a $V_{RMS}$ value.

Advantageously, in Equation 1, the correlation (numerator) is normalized by a factor (denominator) that is independent of the hypothesis (i.e., the $y_k$ values). In some implementations, this is accomplished by deriving the reference power (denominator) from received symbols of other transport channels.

Various types of symbol information may be used in different implementations. In the example of Equation 1, the reference power is based on received pilots (e.g., dedicated pilots in DPCCH). In other implementations, the reference power is generated based on "NULL" symbols. In other implementations, the reference power is generated based on symbols corresponding to silent identifier (SID) transport format (TF) in cases where SID TF was detected. In some implementations, the reference power is generated based on "FULL" symbols including symbols from transport channel B (TrCh-B) and transport channel C (TrCh-C) in cases where "FULL" TF (e.g., full rate TF) is detected. Also, the reference power may be based on a combination of one or more of these or other types of symbol information.

In some aspects, the specific types and number of symbols used may be selected based on performance and computing power (e.g., CPU power) tradeoffs. In some cases, using only NULL symbols may provide sufficient performance, while keeping computing power relatively low. If more symbols are used for the computation of the denominator, the variance of the power estimation may be reduced and therefore the algorithm performance may improve. For example and without limitation, for the "FULL" scenario discussed above, there are many symbols available for the power estimation. Consequently, very high performance may be achieved.

Equation 2 illustrates an example of an $M_{RCM}$ metric where NULL symbols are used in the power estimation.

$$M_{RCM} = \frac{\frac{1}{N_D} \cdot \sum_{k=1}^{N_D} b'_k \cdot y_k}{\sqrt{PowerEst(NULL \text{ sym}, DPsym.)}} \quad \text{EQUATION 2}$$

Where:

NULLsym=the symbols corresponding to the NULL TF location in DPDCH.

Figure 5:
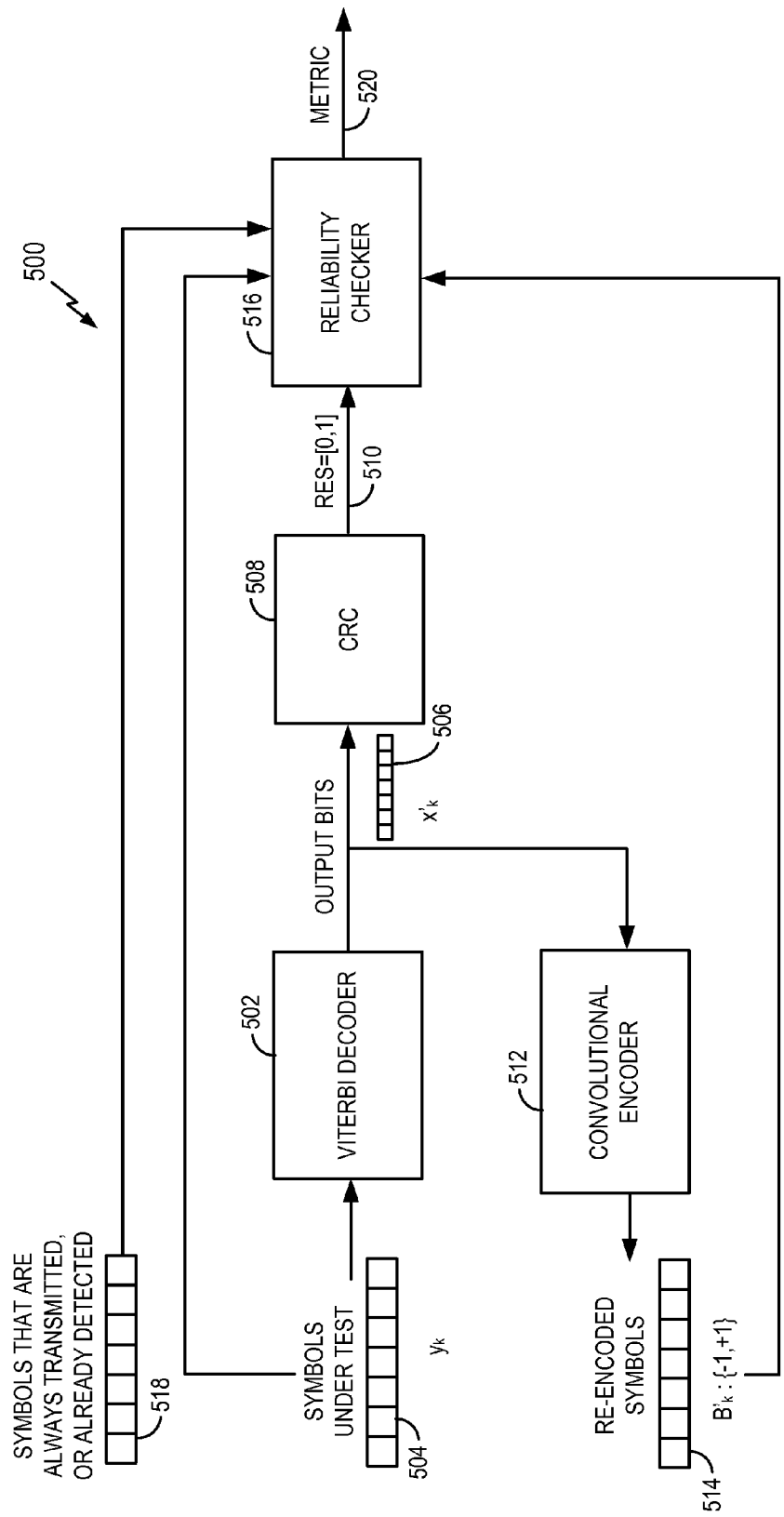
FIG. 5 is a block diagram illustrating an example of a reliability check system in accordance with some aspects of the disclosure.

FIG. 5 illustrates an example of a system 500 for checking the reliability of a block of received symbols. Thus, the system 500 may be incorporated into a receiver (e.g., of a UE) that receives symbols transmitted by a transmitter of another wireless device (e.g., a Node B). In some implementations, the block of symbols (e.g., bits) corresponds to a transmission time interval (TTI). Other implementations could use other intervals (e.g., a frame, etc.).

A Viterbi decoder 502 decodes received symbols 504 and generates a set of output bits 506. The Viterbi decoder 502 decodes a received symbol stream (originally encoded by a corresponding transmitter using convolutional encoding) to generate a bit stream that corresponds, preferably to a high degree, to the bit stream that was encoded at the corresponding transmitter. In practice, due to noise and other factors that affect a transmitted signal, the output of the Viterbi decoder might not precisely correspond to the transmitted bits. That is, the symbol stream may be received with error.

In some cases, the transmitted symbol stream corresponds to a set of information that is taken from a known group of sets of information. For example, a transmitter may transmit control information over a control channel whereby the control information specifies the scheduling assignments and other parameters that can be used by components associated with a receiver (e.g., used by the transmitter of a UE). In practice, there may be a limited number of combinations of this control information. For example, only a certain number of signaling rates may be supported by a communication standard. In addition, only a certain number of channel frequencies may be supported by a communication standard.

Accordingly, a receiver can assume that a symbol stream received over such a control channel will include one of the possible combinations of information. Consequently, the receiver can compare a given received signal stream with each of the possible combinations that could possibly be transmitted by the transmitter. Given that the receiver might not know the timing and location of a given combination of control information within a received symbol stream, the receiver may generate one or more hypotheses corresponding to the combination that the algorithm indicates is the combination that was most likely transmitted. Thus, the receiver (e.g., the Viterbi decoder circuit 502 of FIG. 5) generates at least one decoding hypothesis made up of a set (or block) of bits that according to the algorithm most likely correspond to the bits that the transmitter originally transmitted.

While the example of FIG. 5 depicts the use of the Viterbi decoder 502 for the symbol decoding operation, other types of decoders could be used in other implementations.

A cyclic redundancy check (CRC) component 508 determines whether a given block of the output bits 506 passes CRC and outputs a corresponding PASS/FAIL result 510 (RES[0,1]). CRC is an error detecting code that is used to identify errors in received information. At the transmitter side, the CRC operation involves operating on the information to be transmitted (i.e., using a known error detection algorithm) to generate a check value. This check value is then transmitted along with the information. At the receiver side (i.e., at the CRC component 508), the CRC operation involves operating on the received information (but not the check value) using the same error detection algorithm that was used at the transmitter to generate a second check value. If the second check value matches the received check value, the information is deemed to have passed the CRC.

The system 500 also includes a convolutional encoder 512 that re-encodes the output bits 506 to provide a set of re-encoded symbols 514. Thus, the convolutional encoder 512 employs convolutional encoding (e.g., based on the Viterbi algorithm or some other suitable algorithm) for encoding the hypothesis bits output by the Viterbi decoder 502. In general, this encoding is the same as or similar to the encoding expected to be used by the transmitter that transmitted the symbols from which the hypothesis is derived. Also, in some implementations, the encoding takes into account the channel between the transmitter and the receiver. For example, a receiver can derive a matrix representative of the channel by analyzing known signal patterns sent by the transmitter and taking into account the encoding and other transmission parameters used by the transmitter. Accordingly, if the hypothesis bits are identical to the bits that were originally transmitted, the re-encoded symbols 514 generated by the convolutional encoder 512 should be the same as or very similar to the received symbols 504 (assuming the channel characteristics are properly accounted for). Hence, the re-encoded symbols 514 can be used to test the reliability of the hypothesis.

The result 510 of the CRC operation is passed to a reliability checker 516, along with the received symbols 504, the re-encoded symbols 514, and symbols 518 that are "always transmitted" or already detected. Here, "always transmitted" does not necessarily mean continuously transmitted. For example, symbols 518 that are "always transmitted" could refer to symbols that are expected to be transmitted at some point during each frame or TTI.

The reliability checker 516 generates a reliability metric 520 for each hypothesis of the received symbols 504 that passed CRC. In some implementations, the reliability checker 56 generates the reliability metric 520 using an algorithm as taught herein (e.g., using Equation 1 or 2). In one non-limiting example, the reliability metric 516 may be normalized to have a value between 0 and 1.0, where a larger number indicates higher reliability.

The teachings herein may be used in conjunction with various types of decoding operations. For purposes of illustration, certain aspects of the disclosure are described in the context of a scheme where a reliability metric is generated only for those blocks that passed CRC (i.e., those blocks that did not pass CRC are discarded or otherwise ignored). However, the disclosed concepts also may be used in implementations that perform CRC checking after the generation of the reliability metric, or in implementations that do not perform CRC checking (e.g., implementations that perform some other type of error checking).

Figure 6:
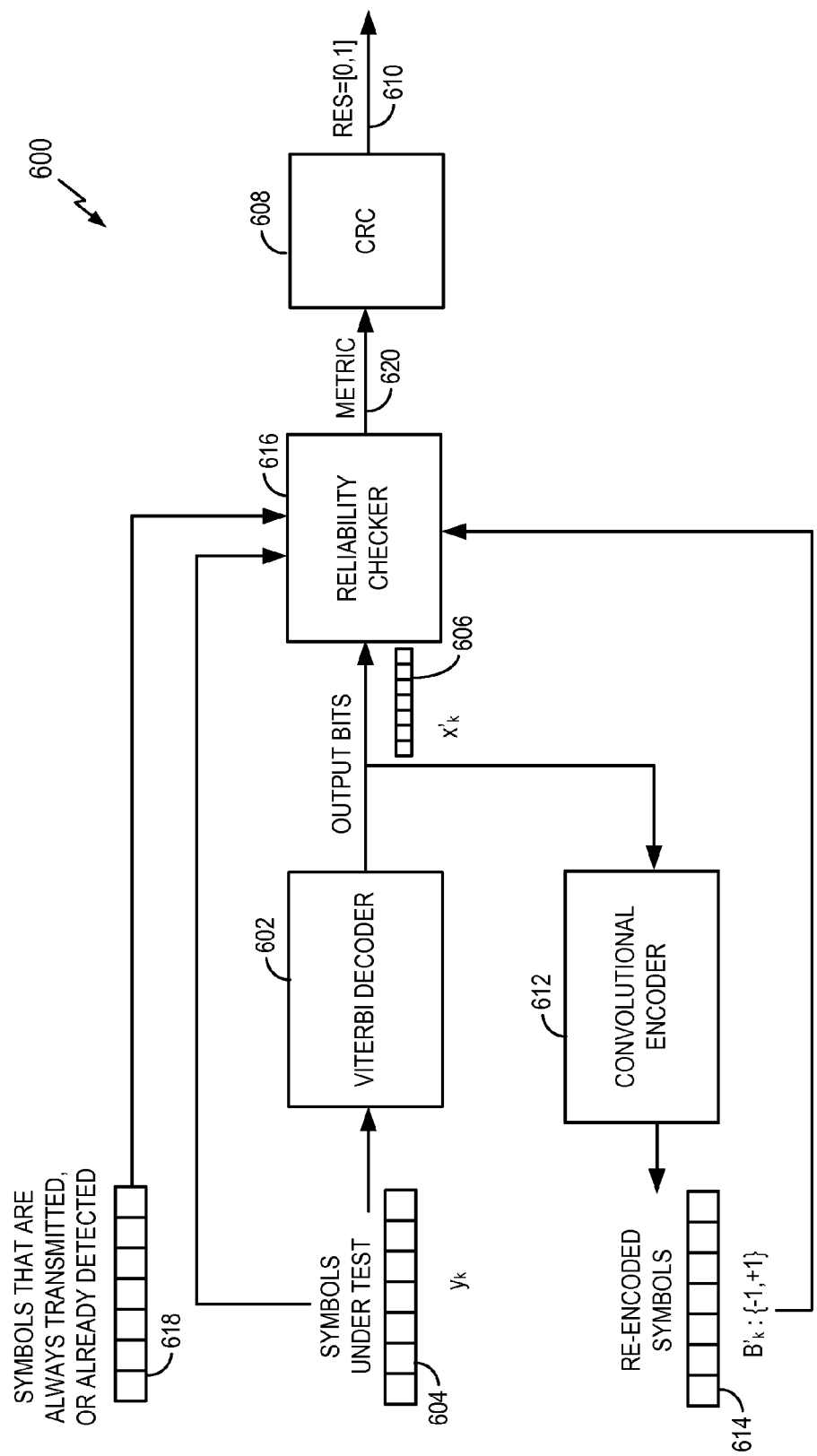
FIG. 6 is a block diagram illustrating another example of a reliability check system in accordance with some aspects of the disclosure.

FIG. 6 illustrates an example of a system 600 where a reliability check is performed before a CRC operation. A Viterbi decoder 602 decodes received symbols 604 and generates a set of output bits 606. A convolutional encoder 612 re-encodes the output bits 606 to provide a set of re-encoded symbols 614. The output bits 606 are also passed to a reliability checker 616, along with the received symbols 604, the re-encoded symbols 614, and symbols 618 that are "always transmitted" or already detected. Based on this information, the reliability checker 616 generates a metric 620 that indicates the reliability of a given block of the output bits 606. For each block of bits deemed sufficiently reliable (e.g., reliability metric above a threshold), a cyclic redundancy check (CRC) component 608 determines whether the block passes CRC and outputs a corresponding PASS/FAIL result 610 (RES[0,1]). The operations of the components of FIG. 6 are similar to the operations described for the corresponding components of FIG. 5.

Figure 7:
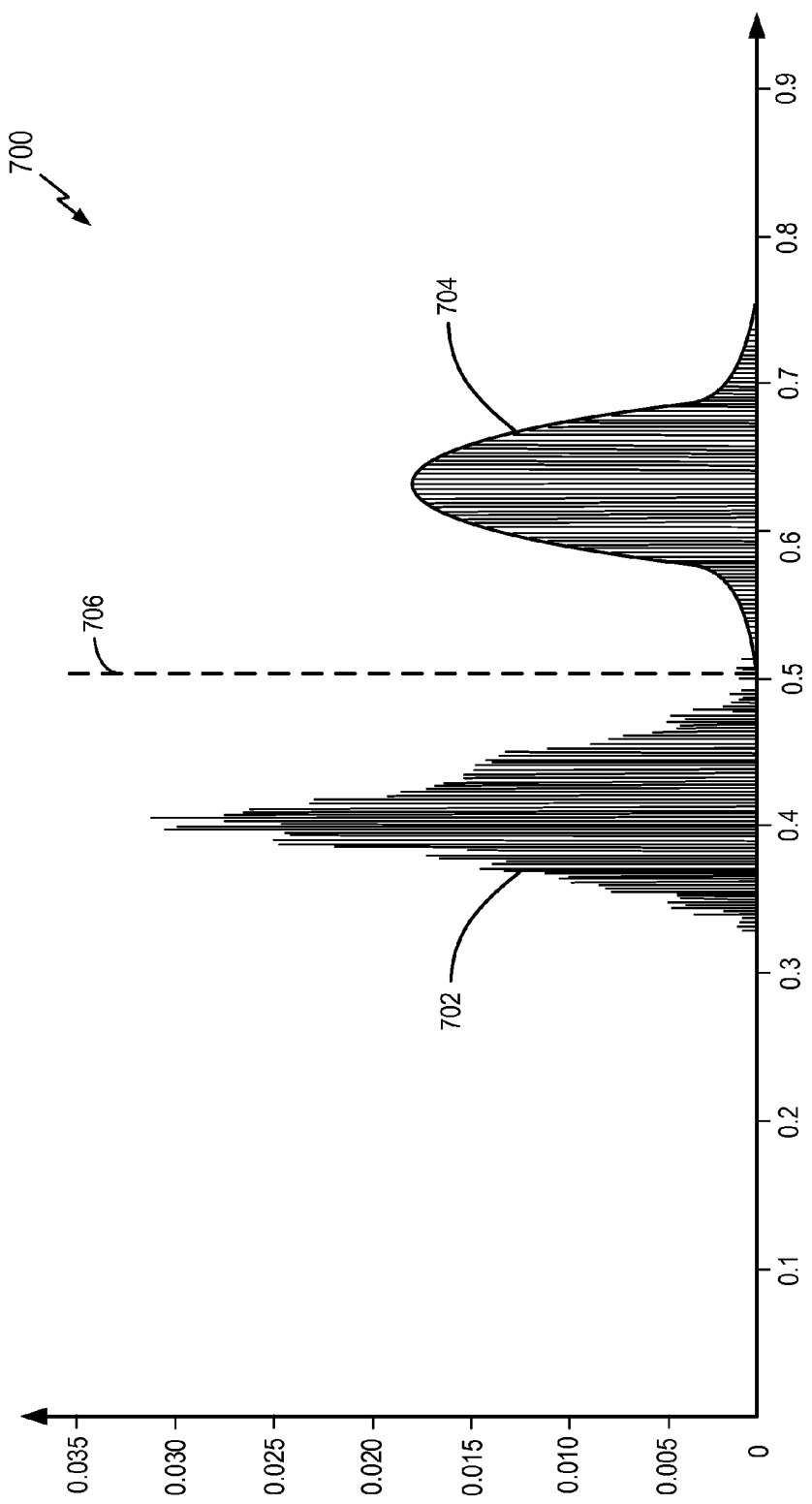
FIG. 7 is a graph illustrating an example of a reliability metric threshold in accordance with some aspects of the disclosure.

FIG. 7 is a graph 700 corresponding to a simulation showing how detection performance may be improved through the use of the detection techniques taught herein. Even at a very low SNR (e.g., SNR=−2 dB), there is little or no overlap between a first pdf histogram 702 for the noise-only case and a second pdf histogram 704 for the signal-exists case due to the use of the disclosed reliability metric. As indicated, a reliability metric threshold 706 may be set in between the first and second pdf histograms 702 and 704. In this example, the reliability metric threshold 706 is defined with a value of approximately 0.5 (e.g., for use with a reliability metric that takes a value between 0 and 1.0).

Figure 8:
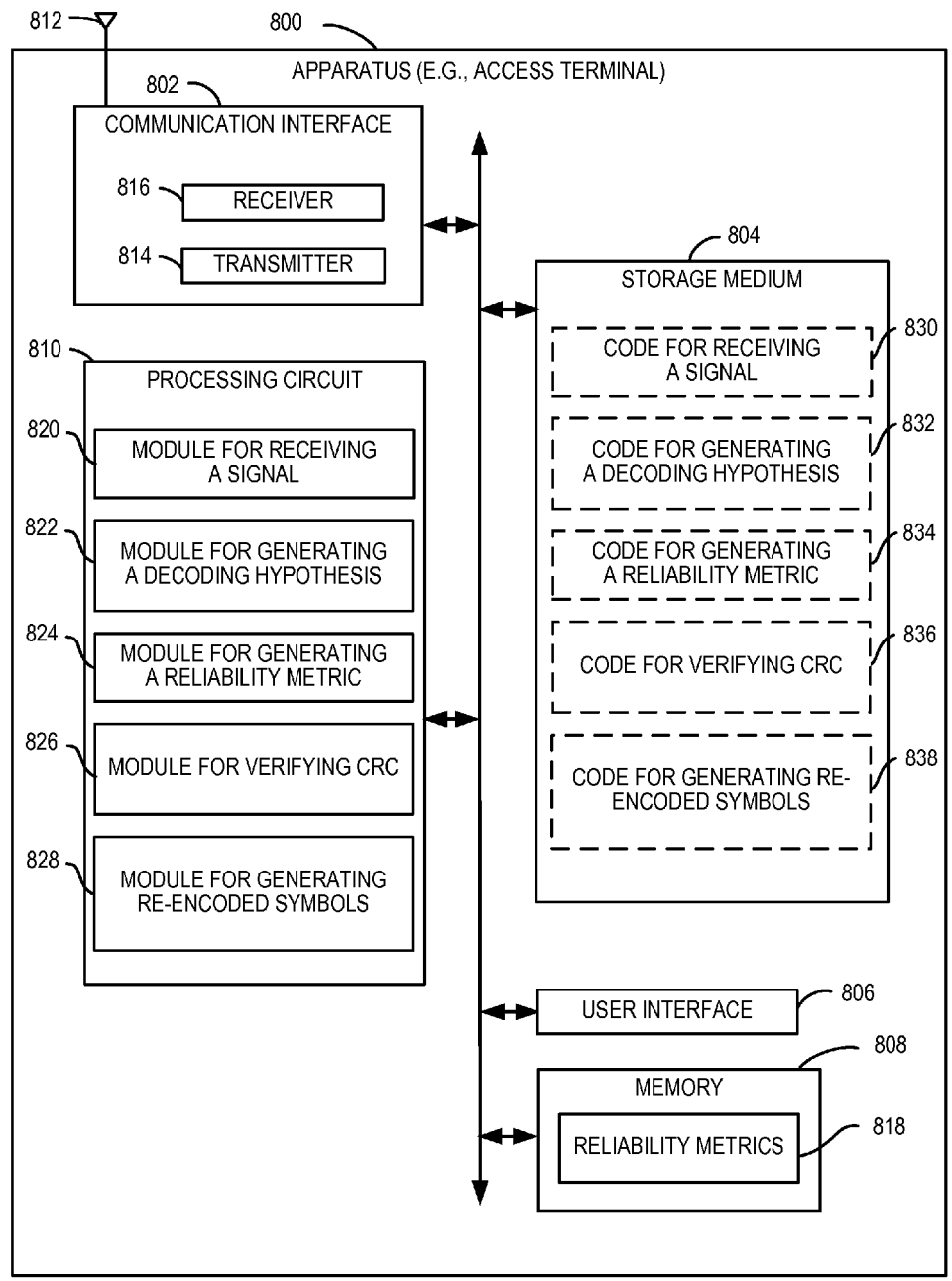
FIG. 8 is a block diagram illustrating select components of an apparatus configured to provide reliability checking in accordance with some aspects of the disclosure.

FIG. 8 is an illustration of an exemplary apparatus 800 (e.g., an access terminal) configured according to one or more aspects of the present disclosure. The apparatus 800 includes a communication interface (e.g., at least one transceiver) 802, a storage medium 804, a user interface 806, a memory 808, and a processing circuit 810. These components can be coupled to and/or placed in electrical communication with one another via a signaling bus or other suitable component. In particular, each of the communication interface 802, the storage medium 804, the user interface 806, and the memory 808 are coupled to and/or in electrical communication with the processing circuit 810.

The communication interface 802 may be adapted to facilitate wireless communication of the apparatus 800. For example, the communication interface 802 may include circuitry and/or programming adapted to facilitate the communication of information bi-directionally with respect to one or more communication devices in a network. The communication interface 802 may be coupled to one or more antennas 812 for wireless communication within a wireless communication system. The communication interface 802 can be configured with one or more standalone receivers and/or transmitters, as well as one or more transceivers. In the illustrated example, the communication interface 802 includes a transmitter 814 and a receiver 816.

The memory 808 may represent one or more memory devices. As indicated, the memory 808 may store reliability metric-related information 818 along with other information used by the apparatus 800. In some implementations, the memory 808 and the storage medium 804 are implemented as a common memory component. The memory 808 may also be used for storing data that is manipulated by the processing circuit 810 or some other component of the apparatus 800.

The storage medium 804 may represent one or more computer-readable, machine-readable, and/or processor-readable devices for storing programming, such as processor executable code or instructions (e.g., software, firmware), electronic data, databases, or other digital information. The storage medium 804 may also be used for storing data that is manipulated by the processing circuit 810 when executing programming. The storage medium 804 may be any available media that can be accessed by a general purpose or special purpose processor, including portable or fixed storage devices, optical storage devices, and various other mediums capable of storing, containing or carrying programming.

By way of example and not limitation, storage medium 804 may include a storage device that includes a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, or any other suitable storage device for storing software and/or instructions that may be accessed and read by a computer or a communication device. The storage medium 804 may be embodied in an article of manufacture (e.g., a computer program product). By way of example, a computer program product may include a computer-readable medium in packaging materials. Thus, in some implementations, the storage medium may be a non-transitory (e.g., tangible) storage medium.

The storage medium 804 may be coupled to the processing circuit 810 such that the processing circuit 810 can read information from, and write information to, the storage medium 804. That is, the storage medium 804 can be coupled to the processing circuit 810 so that the storage medium 804 is at least accessible by the processing circuit 810, including examples where at least one storage medium is integral to the processing circuit 810 and/or examples where at least one storage medium is separate from the processing circuit 810 (e.g., resident in the apparatus 800, external to the apparatus 800, distributed across multiple entities).

Programming stored by the storage medium 804, when executed by the processing circuit 810, causes the processing circuit 810 to perform one or more of the various functions and/or process steps described herein. For example, the storage medium 804 may include operations configured for regulating operations at one or more hardware blocks of the processing circuit 810, as well as to utilize the communication interface 802 for wireless communication utilizing their respective communication protocols.

The processing circuit 810 is generally adapted for processing, including the execution of such programming stored on the storage medium 804. As used herein, the term "programming" or the term "code" shall be construed broadly to include without limitation instructions, instruction sets, data, code, code segments, program code, programs, subprograms, software modules, applications, software applications, software packages, routines, subroutines, objects, executables, threads of execution, procedures, functions, programming, etc., whether referred to as software, firmware, middleware, microcode, hardware description language, or otherwise.

The processing circuit 810 is arranged to obtain, process and/or send data, control data access and storage, issue commands, and control other desired operations. The processing circuit 810 may include circuitry configured to implement desired programming provided by appropriate media in at least one example. For example, the processing circuit 810 may be implemented as one or more processors, one or more controllers, and/or other structure configured to execute executable programming. Examples of the processing circuit 810 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 810 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 810 are for illustration and other suitable configurations within the scope of the present disclosure are also contemplated. Also, any of the modules 820-828 of the processing circuit 810 may be arranged or configured in a similar manner. For example, the modules 820-828 may be arranged to obtain, process and/or send data, control data access and storage, issue commands, and control other desired operations; may be configured to implement desired programming; may be implemented as appropriate structure configured to execute executable programming; may be implemented as a combination of computing components or other circuitry; and so on.

According to one or more aspects of the present disclosure, the processing circuit 810 may be adapted to perform any or all of the features, processes, functions, steps and/or routines for any or all of the apparatuses described herein. As used herein, the term "adapted" in relation to the processing circuit 810 may refer to the processing circuit 810 being one or more of configured, employed, implemented, and/or programmed to perform a particular process, function, step and/or routine according to various features described herein.

According to at least one example of the apparatus 800, the processing circuit 810 may include a module for receiving a signal 820, a module for generating a decoding hypothesis 822, a module for generating a reliability metric 824, a module for verifying CRC 826, and a module for generating re-encoded symbols 828.

The module for receiving a signal 820 may include circuitry and/or programming adapted to perform several functions relating to, for example, receiving a set of symbols. For example, in some implementations, the module for receiving a signal 820 obtains symbols, either directly or via the memory 808, that the receiver 816 received from an access point. In some implementations, the module for receiving a signal 820 decodes received signals to derive the information that is encoded in the signals. The module for receiving a signal 820 outputs received symbol information for access by another component of the processing circuit 810 or some other component of the apparatus 800. For example, the module for receiving a signal 820 can pass acquired information to another component of the apparatus 800 or store acquired information in the memory 808. In some implementations, the programming referred to above includes code for receiving a signal 830 stored on the storage medium 804.

The module for generating a decoding hypothesis 822 may include circuitry and/or programming adapted to perform several functions relating to, for example, providing hypotheses based on a received signal. Initially, the module for generating a decoding hypothesis 822 retrieves symbol information from the module 820 (e.g., passed from the receiver 816) or the memory 808. In some implementations, the module for generating a decoding hypothesis 822 compares a received set of symbols to a plurality of hypotheses (e.g., stored in the memory 808). In some implementations, the module for generating a decoding hypothesis 822 identifies one or more of the hypotheses that have a relatively high probability of corresponding to the originally transmitted information (e.g., a set of control information). The module for generating a decoding hypothesis 822 then outputs one or more of these hypotheses or outputs an indication that identifies one or more of these hypotheses. For example, the module for generating a decoding hypothesis 822 can pass a corresponding set of bits to another component of the apparatus 800 or store the bits in the memory 808. In some implementations, the programming referred to above includes code for generating a decoding hypothesis 832 stored on the storage medium 804.

The module for generating a reliability metric 824 may include circuitry and/or programming adapted to perform several functions relating to, for example, determining the reliability of a decoding hypothesis generated by the module for generating a decoding hypothesis 822. Initially, the module for generating a reliability metric 824 acquires a set of bits output by the module 822. For example, the module for generating a reliability metric 824 may obtain this data directly from the module 822 or from the memory 808. In some implementations, the module for generating a reliability metric 824 uses Equation 1 to generate a metric indicative of the decoding reliability of a given hypothesis. In some implementations, the module for generating a reliability metric 824 uses Equation 2 to generate a metric indicative of the decoding reliability of a given hypothesis. The module for generating a reliability metric 824 then outputs the generated reliability metric. For example, the module for generating a reliability metric 824 can pass the metric to another component of the apparatus 800 or store the indication in the memory 808. In some implementations, the programming referred to above includes code for generating a reliability metric 834 stored on the storage medium 804.

Further, the module for verifying CRC 826 may include circuitry and/or programming adapted to perform several functions relating to, for example, performing a CRC operation on a data set. Initially, the module for verifying CRC 826 acquires data to be checked (e.g., from the memory 808 or directly from the module 822 or the module 824). In some implementations, the module for verifying CRC 826 obtains a CRC value associated with the data set and uses a CRC operation and the CRC value to determine whether the data set passes CRC. The module for verifying CRC 826 outputs an indication (e.g., PASS or FAIL) of the results of the CRC operation. For example, the module for verifying CRC 826 can pass the indication to another component of the apparatus 800 or store the indication in the memory 808. In some implementations, the programming referred to above includes code for verifying CRC 836 stored on the storage medium 804.

Finally, the module for generating re-encoded symbols 828 may include circuitry and/or programming adapted to perform several functions relating to, for example, encoding a hypothesis generated by the module for generating a decoding hypothesis 822. Initially, the module for generating re-encoded symbols 828 acquires bits to be encoded (e.g., from the memory 808 or directly from the module 822). In some implementations, the module for generating re-encoded symbols 828 employs convolutional encoding (e.g., based on the Viterbi algorithm or some other suitable algorithm) for encoding the hypothesis bits. As discussed herein, this encoding is the same as or similar to the encoding expected to be used by the transmitter that transmitted the original symbols, and may take into account the channel between the transmitter and the receiver. The module for generating re-encoded symbols 828 outputs the re-encoded symbols to a designated component. For example, the module for generating re-encoded symbols 828 can pass the symbols to another component of the apparatus 800 or store symbol information in the memory 808. In some implementations, the programming referred to above includes code for generating re-encoded symbols 838 stored on the storage medium 804.

As mentioned above, programming stored by the storage medium 804, when executed by the processing circuit 810, causes the processing circuit 810 to perform one or more of the various functions and/or process steps described herein. For example, the storage medium 804 may include one or more of the code (e.g., operations) for receiving a signal 830, the code for generating a decoding hypothesis 832, the code for generating a reliability metric 834, the code for verifying CRC 836, and the code for generating re-encoded symbols 838.

The processing circuit 810 can thus provide the functionality of the system 500 of FIG. 5 or the system 600 of FIG. 6.

For example, in some implementations the modules 820, 822, 824, 826, and 828 are the system 500 or the system 600. As another example, the modules 830, 832, 834, 836, and 838 can be executed to provide the functionality of the system 500 or the system 600.

Figure 9:
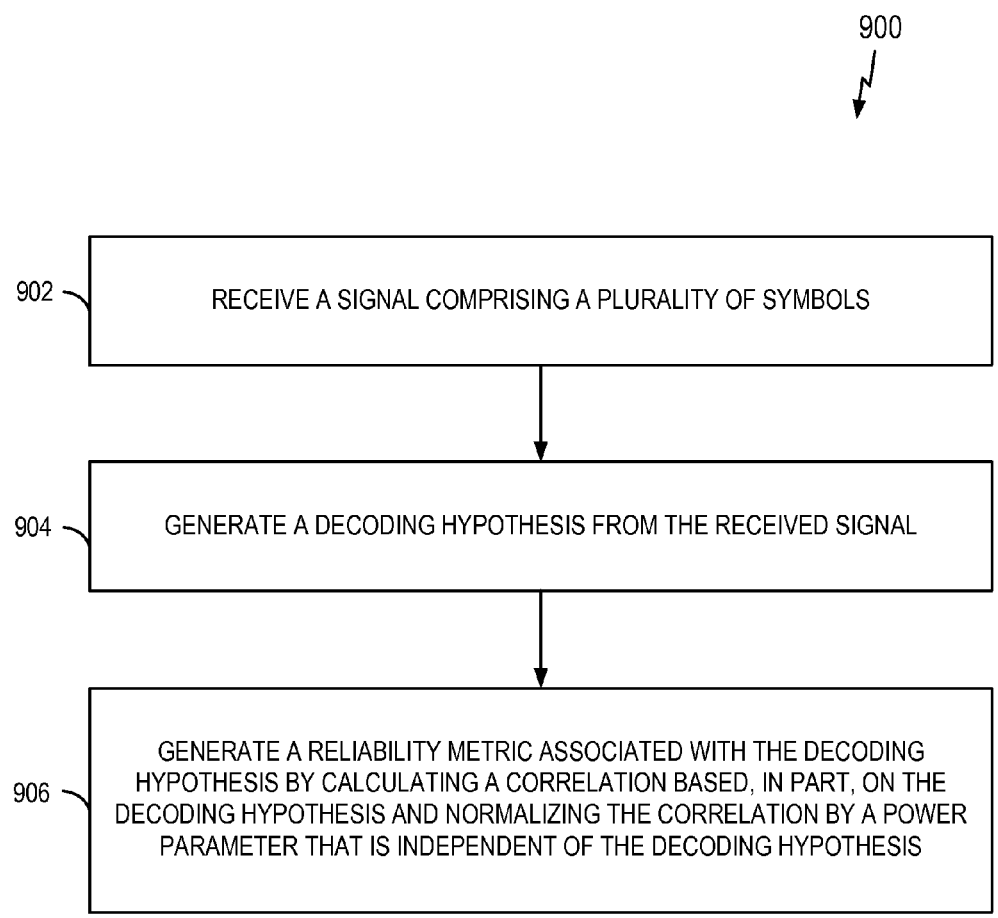
FIG. 9 is a flowchart illustrating a method of reliability checking in accordance with some aspects of the disclosure.

FIG. 9 illustrates a process 900 for generating a reliability metric in accordance with some aspects of the present disclosure. The process 900 may take place within a processing system 1114 (FIG. 11), which may be located at an access terminal (e.g., a UE), at a base station (e.g., a Node B), or some other suitable apparatus. In another aspect, the process 900 may be implemented by the UE 210 and/or the Node B 208 illustrated in FIG. 2. Of course, in various aspects within the scope of the present disclosure, the process 900 may be implemented by any suitable apparatus capable of supporting decoding operations.

In block 902, a signal including a plurality of symbols is received. For example and without limitation, a receiving apparatus may receive a plurality of symbols on a given transport channel over a defined period of time (e.g., a TTI or a frame). In some implementations, the module for receiving a signal 820 of FIG. 8 performs the operations of block 902. In some implementations, the code for receiving a signal 830 of FIG. 8 is executed to perform the operations of block 902.

The received signal may take different forms in different implementations. In some implementations, the received signal includes control data. This control data may be received on a dedicated control channel (DCCH) or on some other suitable channel. In other implementations, the received signal includes data (e.g., application data). This data may be received on a data channel or on some other suitable channel.

In block 904, a decoding hypothesis in the form of a plurality of bits is generated from the received signal. For example and without limitation, the receiving apparatus may attempt to match (e.g., within a given probability) a set of received symbols with one set of a plurality of known sets of symbols. In some implementations, each known set of symbols corresponds to the control data for a given configuration (e.g., a defined communication rate).

In some implementations, the operations of block 904 are performed by the Viterbi decoder 502 of FIG. 5 or the Viterbi decoder 602 of FIG. 6. As discussed herein, in some implementations, the decoding hypothesis is associated with a set of data that has passed a CRC operation. In some implementations, the module for generating a decoding hypothesis 822 of FIG. 8 performs the operations of block 904. In some implementations, the code for generating a decoding hypothesis 832 of FIG. 8 is executed to perform the operations of block 904.

In block 906, a reliability metric associated with the decoding hypothesis is generated. The generation of the reliability metric involves calculating a correlation based, in part, on the decoding hypothesis and normalizing the correlation by a power parameter (e.g., an estimated power parameter) that is independent of the decoding hypothesis. For example, in some implementations, the reliability checker 516 of FIG. 5 or the reliability checker 616 of FIG. 6 generates the reliability metric according to Equation 1. In some implementations, the module for generating a reliability metric 824 of FIG. 8 performs the operations of block 906. In some implementations, the code for generating a reliability metric 834 of FIG. 8 is executed to perform the operations of block 906.

The manner in which the correlation is calculated may take different forms in different implementations. As discussed herein, in some implementations, the decoding hypothesis includes a plurality of symbols and re-encoded symbols are generated based on this decoding hypothesis. In such a case, the correlation may be between the symbols of the decoding hypothesis and the re-encoded symbols.

The power parameter may take different forms in different implementations. For example and without limitation, the power parameter includes a root mean square voltage in some implementations. In some implementations, the power parameter is based on a power estimate associated with a plurality of received NULL symbols and/or a plurality of received pilot symbols.

Figure 10:
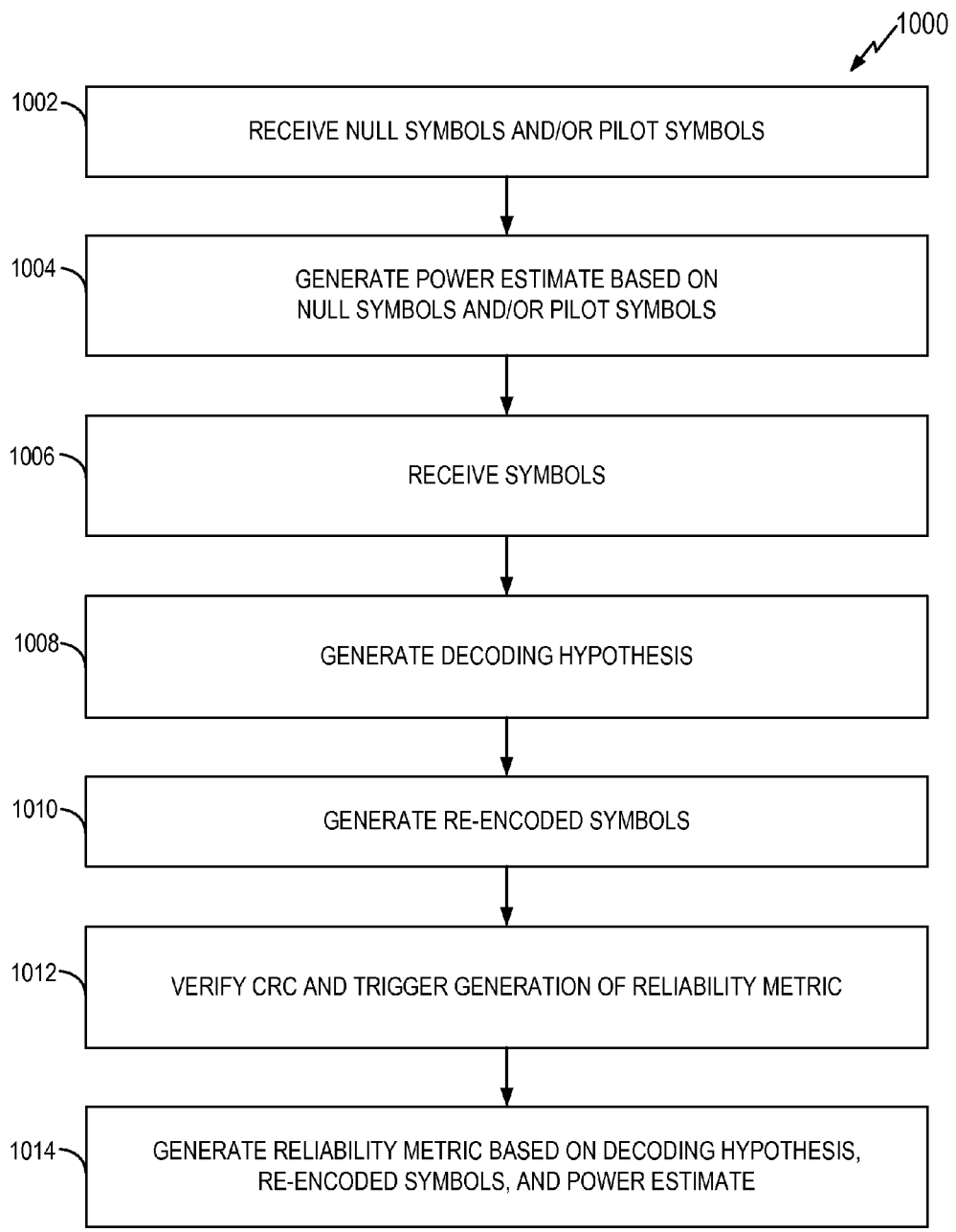
FIG. 10 is a flowchart illustrating additional aspects of a method of reliability checking in accordance with some aspects of the disclosure.

FIG. 10 illustrates a process 1000 including additional operations that may be employed in conjunction with generating a reliability metric in accordance with some aspects of the present disclosure. The process 1000 may take place within a processing system 1114 (FIG. 11), which may be located at an access terminal (e.g., a UE), at a base station (e.g., a Node B), or some other suitable apparatus. In another aspect, the process 1000 may be implemented by the UE 210 and/or the Node B 208 illustrated in FIG. 2. Of course, in various aspects within the scope of the present disclosure, the process 1000 may be implemented by any suitable apparatus capable of supporting decoding operations.

In block 1002, NULL symbols and/or pilot symbols are received. For example and without limitation, a receiving apparatus may receive a plurality of NULL and/or pilot symbols on a given transport channel over a defined period of time (e.g., a TTI or a frame). The NULL symbols may be received, for example and without limitation, on a dedicated physical data channel (DPDCH). The pilot symbols may be received, for example and without limitation, on a dedicated physical control channel (DPCCH). In some implementations, the module for receiving a signal 820 of FIG. 8 performs the operations of block 1002. In some implementations, the code for receiving a signal 830 of FIG. 8 is executed to perform the operations of block 1002.

In block 1004, a power estimate is generated based on the NULL symbols and/or pilot symbols received at block 1002. For example and without limitation, an RMS value of the NULL and/or pilot symbols may be generated. In some implementations, the module for generating a reliability metric 824 of FIG. 8 performs the operations of block 1004. In some implementations, the code for generating a reliability metric 834 of FIG. 8 is executed to perform the operations of block 1004.

In block 1006, a signal is received. The operations of block 1006 correspond to the operations of block 902 of FIG. 9.

In block 1008, a decoding hypothesis is generated based on the received signal. The operations of block 1008 correspond to the operations of block 904 of FIG. 9.

In block 1010, re-encoded symbols are generated based on the decoding hypothesis. For example, in some implementations, the convolutional encoder 512 of FIG. 5 generates re-encoded symbols based on the output of the Viterbi decoder 502. In some implementations, the module for generating re-encoded symbols 828 of FIG. 8 performs the operations of block 1010. In some implementations, the code for generating re-encoded symbols 838 of FIG. 8 is executed to perform the operations of block 1010.

In block 1012, a verification operation is performed to determine whether the received signal satisfies a cyclic redundancy check (CRC) according to a CRC portion (e.g., check value) of the received signal. In some aspects, the generation of the reliability metric is triggered based on this verification. That is, if a block of symbols passes CRC, a reliability metric will be generated for that block. Otherwise, a reliability metric is not generated for the block. In some implementations, the module for verifying CRC 826 of FIG. 8 performs the operations of block 1012. In some implementations, the code for verifying CRC 836 of FIG. 8 is executed to perform the operations of block 1012.

In block 1014, a reliability metric is generated based on the decoding hypothesis, the re-encoded symbols, and the power estimate. For example, in some implementations, the reliability checker 516 of FIG. 5 generates the reliability metric according to Equation 2. In some implementations, the module for generating a reliability metric 824 of FIG. 8 performs the operations of block 1014. In some implementations, the code for generating a reliability metric 834 of FIG. 8 is executed to perform the operations of block 1014.

Figure 11:
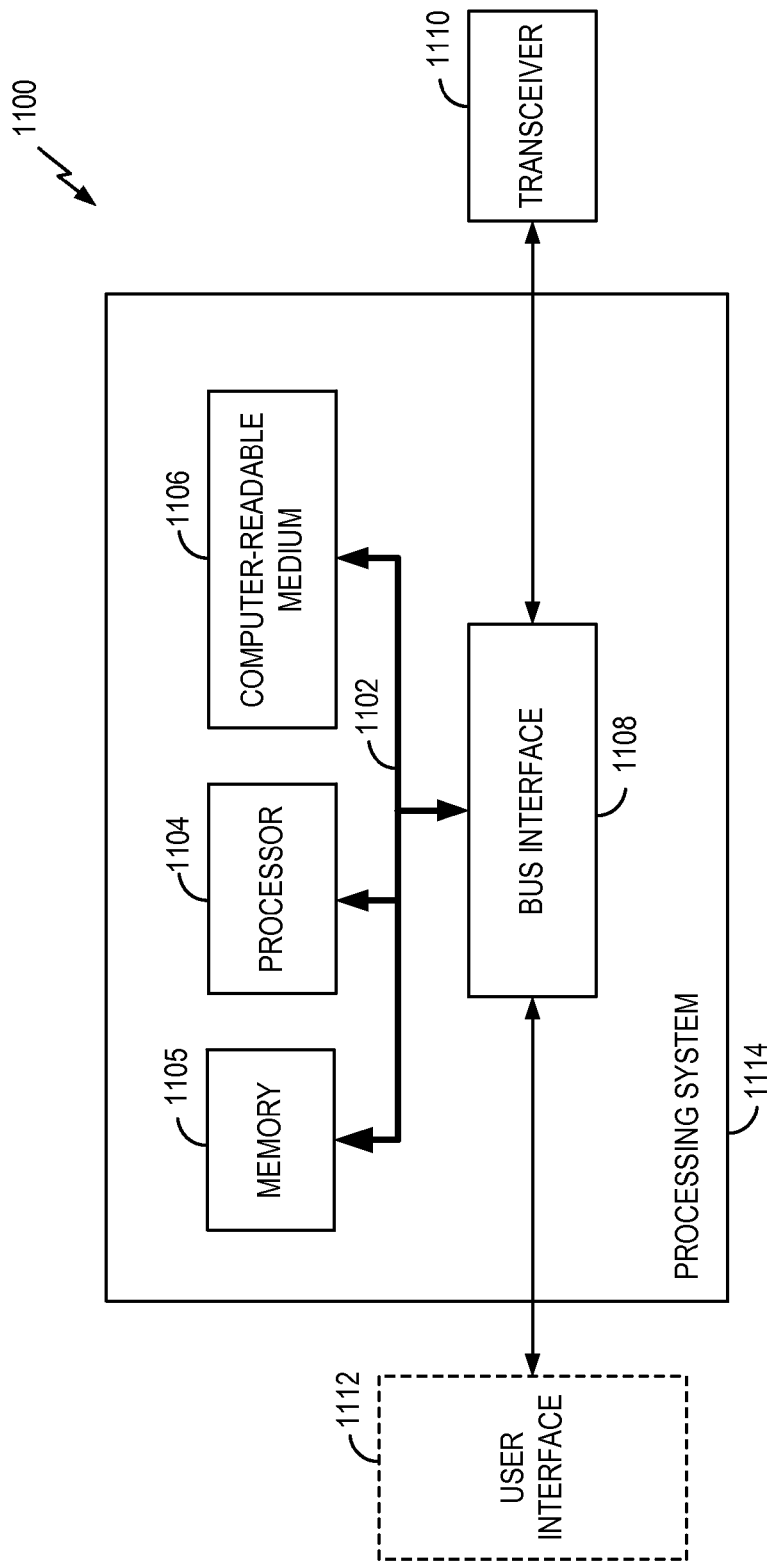
FIG. 11 is a block diagram illustrating an example of a hardware implementation for an apparatus employing a processing system.

FIG. 11 is a conceptual diagram illustrating an example of a hardware implementation for an apparatus 1100 employing a processing system 1114. In accordance with various aspects of the disclosure, an element, or any portion of an element, or any combination of elements disclosed herein may be implemented with a processing system 1114 that includes one or more processors 1104. For example and without limitation, the apparatus 1100 may be a user equipment (UE) as illustrated in any one or more of FIG. 1, 2, or 12. The processor 1104, as utilized in an apparatus 1100, may be used to implement any one or more of the processes described herein and illustrated, for example, in FIGS. 9 and 10.

In this example, the processing system 1114 may be implemented with a bus architecture, represented generally by the bus 1102. The bus 1102 may include any number of interconnecting buses and bridges depending on the specific application of the processing system 1114 and the overall design constraints. The bus 1102 links together various circuits including one or more processors (represented generally by the processor 1104), a memory 1105, and computer-readable media (represented generally by the computer-readable medium 1106). The bus 1102 may also link various other circuits such as timing sources, peripherals, voltage regulators, and power management circuits, which are well known in the art, and therefore, will not be described any further. A bus interface 1108 provides an interface between the bus 1102 and a transceiver 1110. The transceiver 1110 provides a means for communicating with various other apparatus over a transmission medium. Depending upon the nature of the apparatus, a user interface 1112 (e.g., keypad, display, speaker, microphone, joystick) may also be provided.

The processor 1104 is responsible for managing the bus 1102 and general processing, including the execution of software stored on the computer-readable medium 1106. The software, when executed by the processor 1104, causes the processing system 1114 to perform the various functions described below for any particular apparatus. The computer-readable medium 1106 may also be used for storing data that is manipulated by the processor 1104 when executing software.

Figure 12:
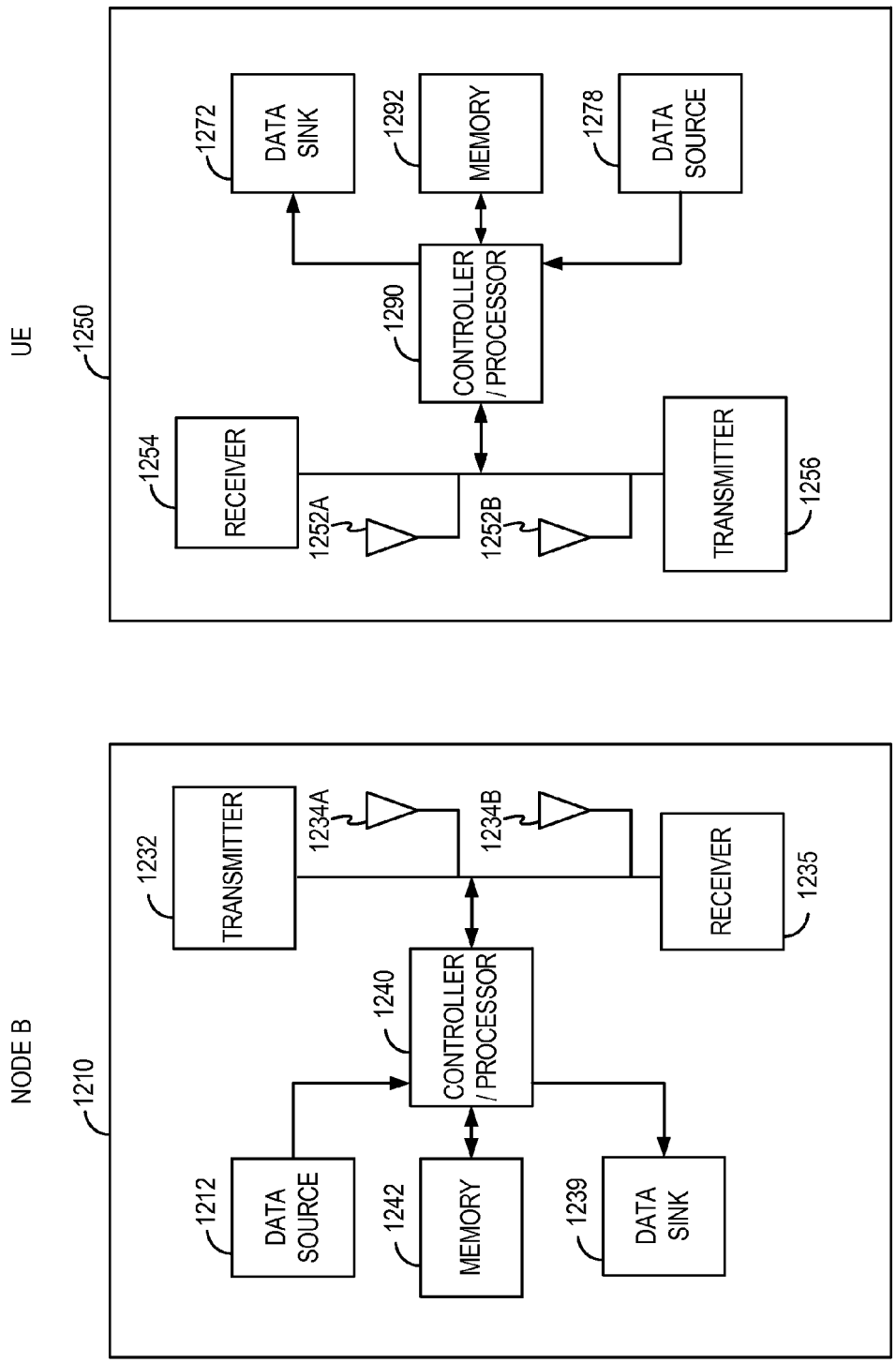
FIG. 12 is a block diagram illustrating an example of a base station in communication with an access terminal in a communication network.

FIG. 12 is a block diagram of an exemplary Node B 1210 in communication with an exemplary UE 1250, where the Node B 1210 may be the Node B 208 in FIG. 2, and the UE 1250 may be the UE 210 in FIG. 2. In the downlink communication, a controller or processor 1240 may receive data from a data source 1212. Channel estimates may be used by a controller/processor 1240 to determine the coding, modulation, spreading, and/or scrambling schemes for the transmit processor 1220. These channel estimates may be derived from a reference signal transmitted by the UE 1250 or from feedback from the UE 1250. A transmitter 1232 may provide various signal conditioning functions including amplifying, filtering, and modulating frames onto a carrier for downlink transmission over a wireless medium through one or more antennas 1234. The antennas 1234 may include one or more antennas, for example, including beam steering bidirectional adaptive antenna arrays, MIMO arrays, or any other suitable transmission/reception technologies.

At the UE 1250, a receiver 1254 receives the downlink transmission through one or more antennas 1252 and processes the transmission to recover the information modulated onto the carrier. The information recovered by the receiver 1254 is provided to a controller/processor 1290. The processor 1290 descrambles and despreads the symbols, and determines the most likely signal constellation points transmitted by the Node B 1210 based on the modulation scheme. These soft decisions may be based on channel estimates computed by the processor 1290. The soft decisions are then decoded and deinterleaved to recover the data, control, and reference signals. The CRC codes are then checked to determine whether the frames were successfully decoded. The data carried by the successfully decoded frames will then be provided to a data sink 1272, which represents applications running in the UE 1250 and/or various user interfaces (e.g., display). Control signals carried by successfully decoded frames will be provided to a controller/processor 1290. When frames are unsuccessfully decoded, the controller/processor 1290 may also use an acknowledgement (ACK) and/or negative acknowledgement (NACK) protocol to support retransmission requests for those frames.

In the uplink, data from a data source 1278 and control signals from the controller/processor 1290 are provided. The data source 1278 may represent applications running in the UE 1250 and various user interfaces (e.g., keyboard). Similar to the functionality described in connection with the downlink transmission by the Node B 1210, the processor 1290 provides various signal processing functions including CRC codes, coding and interleaving to facilitate FEC, mapping to signal constellations, spreading with OVSFs, and scrambling to produce a series of symbols. Channel estimates, derived by the processor 1290 from a reference signal transmitted by the Node B 1210 or from feedback contained in a midamble transmitted by the Node B 1210, may be used to select the appropriate coding, modulation, spreading, and/or scrambling schemes. The symbols produced by the processor 1290 will be utilized to create a frame structure. The processor 1290 creates this frame structure by multiplexing the symbols with additional information, resulting in a series of frames. The frames are then provided to a transmitter 1256, which provides various signal conditioning functions including amplification, filtering, and modulating the frames onto a carrier for uplink transmission over the wireless medium through the one or more antennas 1252.

The uplink transmission is processed at the Node B 1210 in a manner similar to that described in connection with the receiver function at the UE 1250. A receiver 1235 receives the uplink transmission through the one or more antennas 1234 and processes the transmission to recover the information modulated onto the carrier. The information recovered by the receiver 1235 is provided to the processor 1240, which parses each frame. The processor 1240 performs the inverse of the processing performed by the processor 1290 in the UE 1250. The data and control signals carried by the successfully decoded frames may then be provided to a data sink 1239. If some of the frames were unsuccessfully decoded by the receive processor, the controller/processor 1240 may also use an acknowledgement (ACK) and/or negative acknowledgement (NACK) protocol to support retransmission requests for those frames.

The controller/processors 1240 and 1290 may be used to direct the operation at the Node B 1210 and the UE 1250, respectively. For example, the controller/processors 1240 and 1290 may provide various functions including timing, peripheral interfaces, voltage regulation, power management, and other control functions. The computer readable media of memories 1242 and 1292 may store data and software for the Node B 1210 and the UE 1250, respectively.

Conclusion

Several aspects of a telecommunications system have been presented with reference to a W-CDMA system. As those skilled in the art will readily appreciate, various aspects described throughout this disclosure may be extended to other telecommunication systems, network architectures and communication standards.

By way of example, various aspects may be extended to other UMTS systems such as TD-SCDMA and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method for wireless communication, comprising:
   receiving a signal comprising a plurality of symbols;
   generating a decoding hypothesis from the received signal, wherein the decoding hypothesis comprises a plurality of bits; and
   generating a reliability metric associated with the decoding hypothesis by calculating a correlation based on the decoding hypothesis and normalizing the correlation by a power parameter that is independent of the decoding hypothesis.

2. The method of claim 1, further comprising verifying that the decoding hypothesis satisfies a cyclic redundancy check (CRC) according to a CRC portion of the received signal, wherein the generation of the reliability metric is triggered based on the verification.

3. The method of claim 1, wherein:
   the decoding hypothesis comprises a plurality of encoded symbols from which the plurality of bits are generated;
   the method further comprises generating a plurality of re-encoded symbols from the plurality of bits; and
   the correlation is calculated based on the encoded symbols of the decoding hypothesis and the re-encoded symbols.

4. The method of claim 1, further comprising receiving a plurality of NULL symbols, wherein the power parameter is based on a power estimate associated with the received NULL symbols.

5. The method of claim 4, wherein the NULL symbols are received on a dedicated physical data channel (DPDCH).

6. The method of claim 1, further comprising receiving a plurality of pilot symbols, wherein the power parameter is based on a power estimate associated with the received pilot symbols.

7. The method of claim 6, wherein the pilot symbols are received on a dedicated physical control channel (DPCCH).

8. The method of claim 1, wherein the power parameter comprises a root mean square voltage.

9. The method of claim 1, wherein the received signal comprises control data.

10. The method of claim 9, wherein the control data is received on a dedicated control channel (DCCH).

11. An apparatus for wireless communication, comprising:
means for receiving a signal comprising a plurality of symbols;
means for generating a decoding hypothesis from the received signal; and
means for generating a reliability metric associated with the decoding hypothesis by calculating a correlation based on the decoding hypothesis and normalizing the correlation by a power parameter that is independent of the decoding hypothesis.

12. The apparatus of claim 11, further comprising means for verifying that the decoding hypothesis satisfies a cyclic redundancy check (CRC) according to a CRC portion of the received signal, wherein the generation of the reliability metric is triggered based on the verification.

13. The apparatus of claim 11, wherein:
the decoding hypothesis comprises a plurality of encoded symbols from which a plurality of bits are generated;
the apparatus further comprises means for generating a plurality of re-encoded symbols based on the plurality of bits; and
the correlation is calculated based on the encoded symbols of the decoding hypothesis and the re-encoded symbols.

14. The apparatus of claim 11, wherein:
the means for receiving is configured to receive a plurality of NULL symbols; and
the power parameter is based on a power estimate associated with the received NULL symbols.

15. The apparatus of claim 14, wherein the NULL symbols are received on a dedicated physical data channel (DPDCH).

16. The apparatus of claim 11, wherein:
the means for receiving is configured to receive a plurality of pilot symbols; and
the power parameter is based on a power estimate associated with the received pilot symbols.

17. The apparatus of claim 16, wherein the pilot symbols are received on a dedicated physical control channel (DPCCH).

18. The apparatus of claim 11, wherein the power parameter comprises a root mean square voltage.

19. The apparatus of claim 11, wherein the received signal comprises control data.

20. The apparatus of claim 19, wherein the control data is received on a dedicated control channel (DCCH).

21. An apparatus for wireless communication, comprising:
at least one processor; and
a memory coupled to the at least one processor,
wherein the at least one processor is configured to:
receive a signal comprising a plurality of symbols;
generate a decoding hypothesis from the received signal; and
generate a reliability metric associated with the decoding hypothesis by calculating a correlation based on the decoding hypothesis and normalizing the correlation by a power parameter that is independent of the decoding hypothesis.

22. The apparatus of claim 21, wherein:
the at least one processor is further configured to verify that the decoding hypothesis satisfies a cyclic redundancy check (CRC) according to a CRC portion of the received signal; and
the generation of the reliability metric is triggered based on the verification.

23. The apparatus of claim 21, wherein:
the decoding hypothesis comprises a plurality of encoded symbols from which a plurality of bits are generated;
the at least one processor is further configured to generate a plurality of re-encoded symbols based on the plurality of bits; and
the correlation is calculated based on the encoded symbols of the decoding hypothesis and the re-encoded symbols.

24. The apparatus of claim 21, wherein:
the at least one processor is further configured to receive a plurality of NULL symbols; and
the power parameter is based on a power estimate associated with the received NULL symbols.

25. The apparatus of claim 21, wherein:
the at least one processor is further configured to receive a plurality of pilot symbols; and
the power parameter is based on a power estimate associated with the received pilot symbols.

26. A non-transitory computer-readable medium comprising instructions for causing a computer to:
receive a signal comprising a plurality of symbols;
generate a decoding hypothesis from the received signal; and
generate a reliability metric associated with the decoding hypothesis by calculating a correlation based on the decoding hypothesis and normalizing the correlation by a power parameter that is independent of the decoding hypothesis.

27. The computer-readable medium of claim 26, wherein:
the computer-readable medium further comprises instructions for causing the computer to verify that the decoding hypothesis satisfies a cyclic redundancy check (CRC) according to a CRC portion of the received signal; and
the generation of the reliability metric is triggered based on the verification.

28. The computer-readable medium of claim 26, wherein:
the decoding hypothesis comprises a plurality of encoded symbols from which a plurality of bits are generated;
the computer-readable medium further comprises instructions for causing the computer to generate a plurality of re-encoded symbols based on the plurality of bits; and
the correlation is calculated based on the encoded symbols of the decoding hypothesis and the re-encoded symbols.

29. The computer-readable medium of claim 26, wherein:
the computer-readable medium further comprises instructions for causing the computer to receive a plurality of NULL symbols; and
the power parameter is based on a power estimate associated with the received NULL symbols.

30. The computer-readable medium of claim 26, wherein:
the computer-readable medium further comprises instructions for causing the computer to receive a plurality of pilot symbols; and
the power parameter is based on a power estimate associated with the received pilot symbols.

* * * * *